United States Patent [19]

Spencer

[11] Patent Number: 5,028,585
[45] Date of Patent: Jul. 2, 1991

[54] SUPERCONDUCTING OXIDE FCC OXIDE COMPOSITE COMPOSITIONS AND METHOD OF MAKING SUCH COMPOSITIONS

[75] Inventor: Nicholas D. Spencer, Washington, D.C. 20015

[73] Assignee: W. R. Grace & Co.-Conn., New York, N.Y.

[21] Appl. No.: 194,058

[22] Filed: May 13, 1988

Related U.S. Application Data

[63] Continuation-in-part of Ser. No. 155,340, Feb. 12, 1988, which is a continuation-in-part of Ser. No. 95,083, Sep. 11, 1987.

[51] Int. Cl.$^5$ ............................................. H01B 12/00
[52] U.S. Cl. ......................................... 505/1; 505/738; 505/785
[58] Field of Search .................. 505/1, 737, 738, 779, 505/780, 782, 785

[56] References Cited

U.S. PATENT DOCUMENTS

| 4,880,771 | 6/1989 | Cava et al. ............................... 505/1 |
| 4,894,361 | 7/1989 | Subramanian ........................... 505/1 |

FOREIGN PATENT DOCUMENTS

| 0284061 | 9/1988 | European Pat. Off. . |
| 0284062 | 9/1988 | European Pat. Off. . |

OTHER PUBLICATIONS

Franck et al. "Supercono in Systems of Comp. ($M_xY_{1-x}Ba_2Cu_3O_{6.5-8}$) M=AL, GA, Bi", Reviews of Solid State Science, vol. 1, No. 2, 1987, pp. 405-410.
Szytula et al., "Superconducting Phases in the Y—Ba—Cu—Bi System", Acta Physica Polonica, vol. A73 (1988), pp. 169-171.
Richert et al., "Atomic Subs. in YBa, $Cu_3O_7$: Modification of the Electronic Structure", American Institute of Physics 1988, pp. 277-283.
G. F. Holland and A. M. Stacy, Accounts of Chemical Research, 1988, 21, pp. 8-15.

Primary Examiner—William R. Dixon, Jr.
Assistant Examiner—Chris Gallo
Attorney, Agent, or Firm—William W. McDowell, Jr.; Steven Capella

[57] ABSTRACT

Two or more superconductors are reacted together to form a non-superconducting phase encapsulating a residual superconducting phase. For example $YBa_2Cu_3$ oxide is reacted with $Bi_2Sr_2CaCu_2$ oxide to form a superconducting product containing a novel non-superconducting oxide of Y, Bi, and Ba. A superconducting $YBa_2Cu_3$ oxide remains as an interconnected phase throughout the product. The new non-superconducting phase largely encapsulates and insulates the superconducting phase.

7 Claims, 5 Drawing Sheets

FIG.6A
FIG.6B
FIG.6C
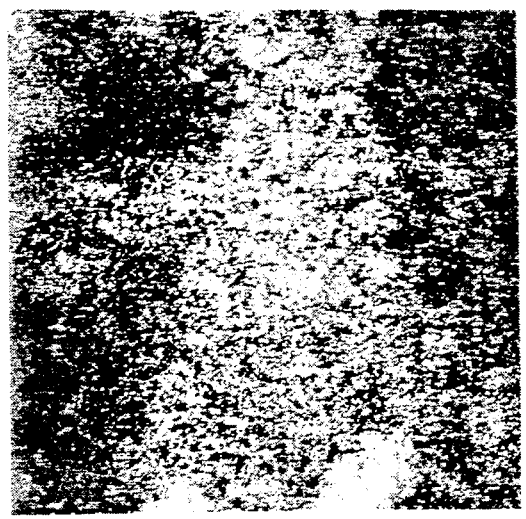
FIG.6D
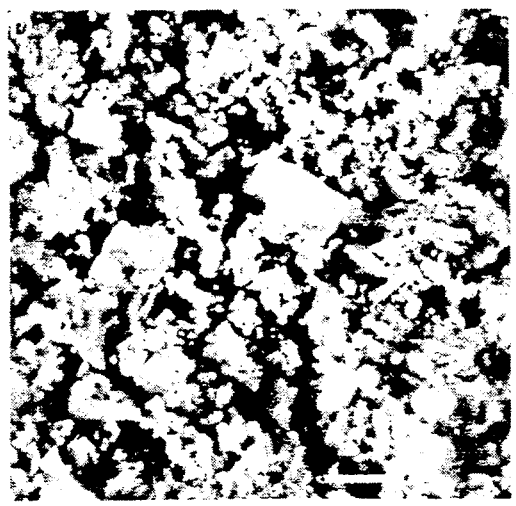

SUPERCONDUCTING OXIDE FCC OXIDE COMPOSITE COMPOSITIONS AND METHOD OF MAKING SUCH COMPOSITIONS

This is a continuation-in-part of U.S. Ser. No. 155,340 filed Feb. 12, 1988, which is a continuation-in-part of U.S. Ser. No. 095,083 filed Sept. 11, 1987. Both applications are incorporated herein by reference in their entireties.

FIELD OF THE INVENTION

The invention relates to the preparation and/or modification of superconducting ceramics.

SUMMARY OF THE INVENTION

Two or more compositions, at least one of which is a superconductor, are reacted together at high temperatures to form one or more new compositions. For example, two known superconductors, $YBa_2Cu_3$ oxide and $Bi_2Sr_2CaCu_2$ oxide are reacted together at 950° C., with formation of a new compound, a face-centered cubic crystal oxide of Y, Bi, and Ba, which is not superconducting. The $Bi_2Sr_2CaCu_2$ oxide completely disappears. The overall composition is nevertheless still superconducting if the $YBa_2Cu_3$ was present in excess prior to reaction because the remaining $YBa_2Cu_3$ oxide is the "continuous" phase and is still superconducting. In another embodiment the product to be calcined is formed from a co-precipitated mixture of carbonates of the desired metals.

The new YBiBa oxide encapsulates the $YBa_2Cu_3$ oxide and thus offers the modified superconductor a measure of protection from thermal and mechanical shock as well as from atmospheric contact.

BACKGROUND OF THE INVENTION

It has long been known that the effective resistivity of certain metals was sometimes substantially eliminated when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (°K.), and certain niobium alloys are known to be superconductive at about 15° K., some as high as about 23° K.

Discovery of superconductivity in the system La-Ba-Cu-O (J. G. Bednorz and K. A. Muller, *Zeit. Phys. B* 64, 189-193 [1986]) and in the system Y-Ba-Cu-O (Wu et al, *Phys. Rev. Lett.* 58, 908-910 [1987]) has stimulated the search for other systems, particularly with a view to substituting other elements for the rare earths (RE) used in the earlier materials. For example, replacement of RE by Bi and Tl has been reported (papers in press). In preparing the system Tl-Ba-Cu-O, Z. Z. Sheng and A. M. Hermann (Superconductivity in the Rare Earth-Free Tl-Ba-Cu-O System above Liquid Nitrogen Temperature) (communication from the authors), first mixed and ground $BaCO_3$ and CuO to obtain a product which they heated, then intermittently reground to obtain a uniform black Ba-Cu-Oxide powder, which was then mixed with $Tl_2O_3$, ground, and heated, with formation of a superconducting material. It was noted that the Tl oxide partially melted and partially vaporized.

The superconductor system Tl-Ca-Ba-Cu-O was also reported in a paper by Sheng and Hermann, "Bulk Superconductivity at 120K in the Tl-Ca-Ba-Cu-O System" (communication from the authors). The authors reported "stable and reproducible bulk superconductivity above 120K with zero resistance above 100K". According to the paper the composition was prepared by mixing and grinding together $Tl_2O_3$, CaO, and $BaCu_3O_4$. The ground mixture was pressed into a pellet and heated in flowing oxygen. The result was cooled and found to be superconducting.

See also the paper by Hazen et al, "100K Superconducting Phases in the Tl-Ca-Ba-Cu-O System" (communication from the authors) which refers to two superconducting phases, $Tl_2Ca_2Ba_2Cu_3O_{10+\delta}$ and $Tl_2Ca_1Ba_2Cu_2O_{8+\delta}$, both with onset $T_c$ near 120K and zero resistivity at 100K. Preparation included grinding together $Tl_2O_3$, CaO, and $BaCu_3O_4$ (or $Ba_2Cu_3O_5$), followed by heating.

And see "Nota Bene" in *High $T_c$ Update*, vols. 2, No. 6, p.1, Mar. 15, 1988, further re properties of the Tl-Ca-Ba-Cu-O system.

Wang et al, Comparison of Carbonate, Citrate, and Oxalate Chemical Routes to the High-$T_c$ Metal Oxide Superconductors $La_{2-x}Sr_xCuO_4$, Inorg. Chem. 26, 1474-1476 (1987) discloses a carbonate precipitation technique. The precipitant was $K_2CO_3$. According to the paper, it was necessary to wash the precipitate repeatedly, an obvious disadvantage in production work. Washing was necessary because potassium adversely affects superconductivity properties of the finished material. If I wash repeatedly in the co-precipitated carbonate process (below described) I remove barium, a highly detrimental loss in my process.

From the technical viewpoint it may seem obvious that co-precipitated carbonates would provide enhanced homogeneity. However, the technical solution to the problem encounters serious difficulties. Thus, the Wang et al process, using potassium carbonate (or sodium carbonate) necessitated numerous washings and apparently left detectable amounts of alkali in the ceramic base even so. As noted, serial washings remove Ba, and would be unworkable in my process. Nor is it merely sufficient that the carbonate be derived from a cation that would burn off completely. For example, ammonium carbonate does not work, because a pH below 7 is required to prevent formation of copper tetrammine, but under these conditions bicarbonate ion is formed, with consequent formation of barium bicarbonate, which, being slightly soluble disrupts the desired stoichiometry. Quaternary ammonium carbonates, on the other hand, form the desired metal carbonates simply and cleanly without troublesome side-formation of complexes or coordination compounds, with firm and precise retention of the intended stoichiometry. The coated particles are readily recovered for further processing.

So far as I have been able to determine, two known superconductors have never before been reacted together.

The inventive concept is not limited to the examples presented here. It is expected to extend to duos, triads, etc., of other superconductors with formation of new compounds. Materials considered within the inventive concept include the oxide system L-M-A, where L is at least one trivalent metal, including Bi, Sc, V, and other rare earths; M is at least one bivalent metal, including Ba, Be, Mg, Ca, and Sr; and A is at least one metal of multiple valency including Nb, Cu, Ag, and Au.

These may be reacted in the "melt", or the total mix may be formed by carbonate coprecipitation, as may be feasible and appropriate. It is not required that all the initial materials be superconductors.

In the Figures:

FIGS. 6A–6D show electron micrographs and elemental maps of fracture surfaces of certain of the invention products.

DETAILED DESCRIPTION OF THE INVENTION

Figure 1:
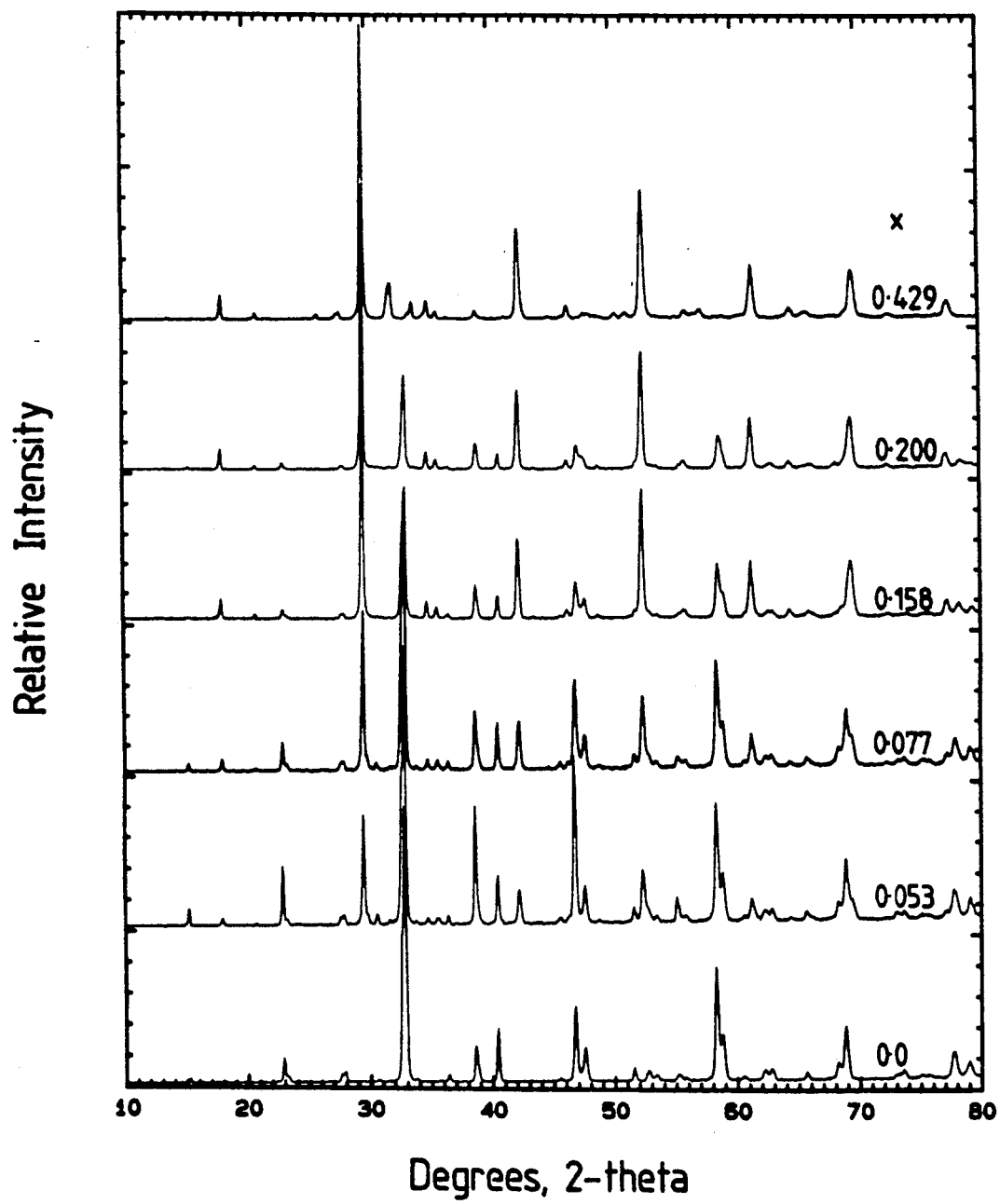
FIG. 1 shows X-ray powder diffraction patterns for $(YBa_2Cu_3)_{(1-x)}(Bi_2Sr_2CaCu_2)_xO_y$, made by the "composite" method for increments of x from zero to 0.429.

As above noted, the invention process is a general one. It will be exemplified using two known superconductors, namely the oxides of $YBa_2Cu_3$ and $Bi_2Sr_2CaCu_2$.

$Bi_2Sr_2CaCu_2O_{8+x}$ reacts with $YBa_2Cu_3O_{7-x}$ at 950° C. to produce a new, face-centered cubic phase with a=8.55 Angstroms containing Y, Bi and Ba. This phase appears to be isomorphous with the high-temperature form of $Cd_3Bi_{10}O_{18}$. Reacted samples are superconducting at values of x as high as 0.2 in the compositional formula $(YBa_2Cu_3)_{(1-x)}(Bi_2Sr_2CaCu_2)_xO_y$ with a $T_c$ of approximately 83K. x=0.2 corresponds to a material with approximately 60 wt. % cubic phase and 40 wt. % residual $YBa_2Cu_3O_{7-x}$. The cubic phase is not superconducting above 77K, but when prepared via a solution-phase route, shows a semiconductor-to-metal transition at approximately 120K. Critical temperatures for the $0<x\leq0.2$ compositions appear to be independent of x.

$YBa_2Cu_3O_{7-x}$ ("Y-123" and $Bi_2Sr_2CaCu_2O_{8+x}$ ("Bi-2212") are both superconductors with $T_c>77K$, but they have quite distinct crystal structures (1-2). (References collected below.) There is already a considerable amount of literature on substitution of transition metal ions into the Y-123 structure (3-6), but not, so far as I am aware, on the reaction of the two superconducting materials together.

This invention involves the products of the reaction between Y-123 and Bi-2212 at a temperature that lies between the melting points of the two materials (950° C.). The invention also includes materials of similar composition, synthesized by a coprecipitated carbonate process, starting with the salts of the individual component metals. (The "coprecipitated carbonate" process is described hereinafter.)

Two sets of materials of general formula $(YBa_2Cu_3)_{(1-x)}(Bi_2Sr_2CaCu)_2)_xO_y$ were prepared, and are listed in Table I.

TABLE I

PREPARATION METHOD, OVERALL COMPOSITION AND $T_c$ FOR $(YBa_2Cu_3)_{(1-x)}(Bi_2Sr_2CaCu_2)_xO_y$ SAMPLES

| Synthetic Method | x | $T_c$ (zero resistance)/K |
|---|---|---|
| Composite | 0.053 | 83 |
| Composite | 0.077 | 83 |
| Composite | 0.158 | 83 |
| Composite | 0.200 | 83 |
| Composite | 0.429 | semiconductor |
| Coprecipitated | 0.053 | 83 (non-zero) |
| Coprecipitated | 0.077 | 83 |
| Coprecipitated | 0.158 | 83 (non-zero) |
| Coprecipitated | 0.200 | 85 (non-zero) |
| Coprecipitated | 0.429 | semi-conductor to Ca. 120K, metal below |

In one set, composites of Y-123 and Bi-2212 were synthesized by grinding the individual superconductors together in the correct ratios in an agate mortar, pressing them into pellets at 20,000 p.s.i. and firing. The starting superconductive (W. R. Grace and Co. Super-$T_c$-Y123 and Super $T_c$-B2212) had a particle size of 1–10 μm and a chemical purity of >99.9%. The firing schedule involved heating at 950° C. for six hours, cooling to 600° over two hours and then cooling to 400° C. over In the other set, the samples were prepared by coprecipitation as carbonates from a solution containing the mixed metal nitrates in the correct stoichiometric ratios. The process is described in U.S. Ser. No. 155,340 filed Feb. 12, 1988, above referenced. In the process the aqueous solution of the mixed metal nitrates (Y.Ba, Cu, Bi, Sr, and Ca) are reacted with an aqueous solution of a quaternary ammonium carbonate, e.g., tetramethylammonium carbonate, by adding nitrates and quaternary carbonate separately slowly into a reaction vessel, while maintaining the pH in the latter in the range of about 7.5–10 by drip-wise addition of tetramethylammonium hydroxide. The precipitated carbonates were dried at 110° C. and then heated at 540° C. in air for 2 hours. The mixed oxides and carbonates produced in this way were then heated in oxygen at 800° C. for 12 hours, cooled to 600° C. over two hours and to 400° C. over eight hours. The gray-black powders were then pressed into pellets and fired, using the same conditions as described for the composite pellets. The metal nitrates (Aldrich Chemical Co.) were of ≦99.9% purity. In both composite and coprecipitated samples, the value of x was deliberately restricted to 0.5 in order to avoid melting of the (bismuth-rich) samples at the particular processing temperature chosen.

X-ray powder diffraction patterns were obtained with a Philips APD 3600 diffractometer (graphite monochrometer and theta-compensating slits) using CuKα radiation and a scan rate of 2 deg 2θ min$^{-1}$. The reported line positions were corrected using an internal silicon standard (SRM-640b). Y-123 concentrations were calculated by assuming that the intensity of the lines from the Y-123 phase in the reacted samples was the same as from Y-123 itself, and by constructing a calibration curve based on the x-ray mass absorption coefficients for a binary mixture of Y-123 and Bi-2212.

Scanning electron micrographs were taken on a Hitachi model 5570 with a Kevex 7000 energy dispersive x-ray fluorescence (EDX) unit attached. All images were recorded with a 20 kV electron beam energy A.C. magnetic susceptibility data were taken using a Quantum Technology Corp. Meissner Probe operating at a frequency of 20 kHz and a maximum a.c. field of 1 Oe. Resistivity was measured with a four-point resistance meter (Keithley 580) using indium contacts to the sample pellet.

In FIG. 1, x-ray powder diffraction patterns for the Y-123 starting material and all composite samples are shown. As might be expected, lines characteristic of the Y-123 become less intense as x increases. It is more surprising that by $x=0.429$ these lines have totally disappeared, having become replaced by a majority phase displaying a cubic pattern, together with traces (i.e. relative intensities 10%) of CuO and an unidentified phase. This cubic phase is already clearly visible at $x=0.053$. In none of the samples were lines characteristic of the Bi-2212 superconductor to be seen. The cubic pattern indexes as a face-centered cubic structure with $a=8.55$ Angstroms (see Table II).

TABLE II

POWDER X-RAY DIFFRACTION LINES FOR THE CUBIC PHASE IN $(YBa_2Cu_3)_{(1-x)}(Bi_2Sr_2CaCu_2)_xO_y$ OBTAINED USING CU-K$\alpha$ RADIATION

| h | k | l | d (obs.) | d (calc.) | I/I$_o$ |
|---|---|---|----------|-----------|---------|
| 1 | 1 | 1 | 4.934 | 4.936 | 8 |
| 2 | 0 | 0 | 4.276 | 4.275 | 2 |
| 2 | 2 | 0 | 3.027 | 3.023 | 100 |
| 3 | 1 | 1 | 2.578 | 2.578 | 8 |
| 4 | 0 | 0 | 2.139 | 2.138 | 33 |
| 3 | 3 | 1 | 1.963 | 1.962 | 5 |
| 4 | 2 | 2 | 1.746 | 1.745 | 51 |
| 4 | 4 | 0 | 1.510 | 1.511 | 22 |
| 5 | 3 | 1 | 1.447 | 1.445 | 4 |
| 6 | 0 | 0 | 1.424 | 1.425 | 2 |
| 6 | 2 | 0 | 1.351 | 1.352 | 18 |
| 4 | 4 | 4 | 1.234 | 1.234 | 5 |
| 6 | 4 | 2 | 1.141 | 1.143 | 23 |

Figure 2:
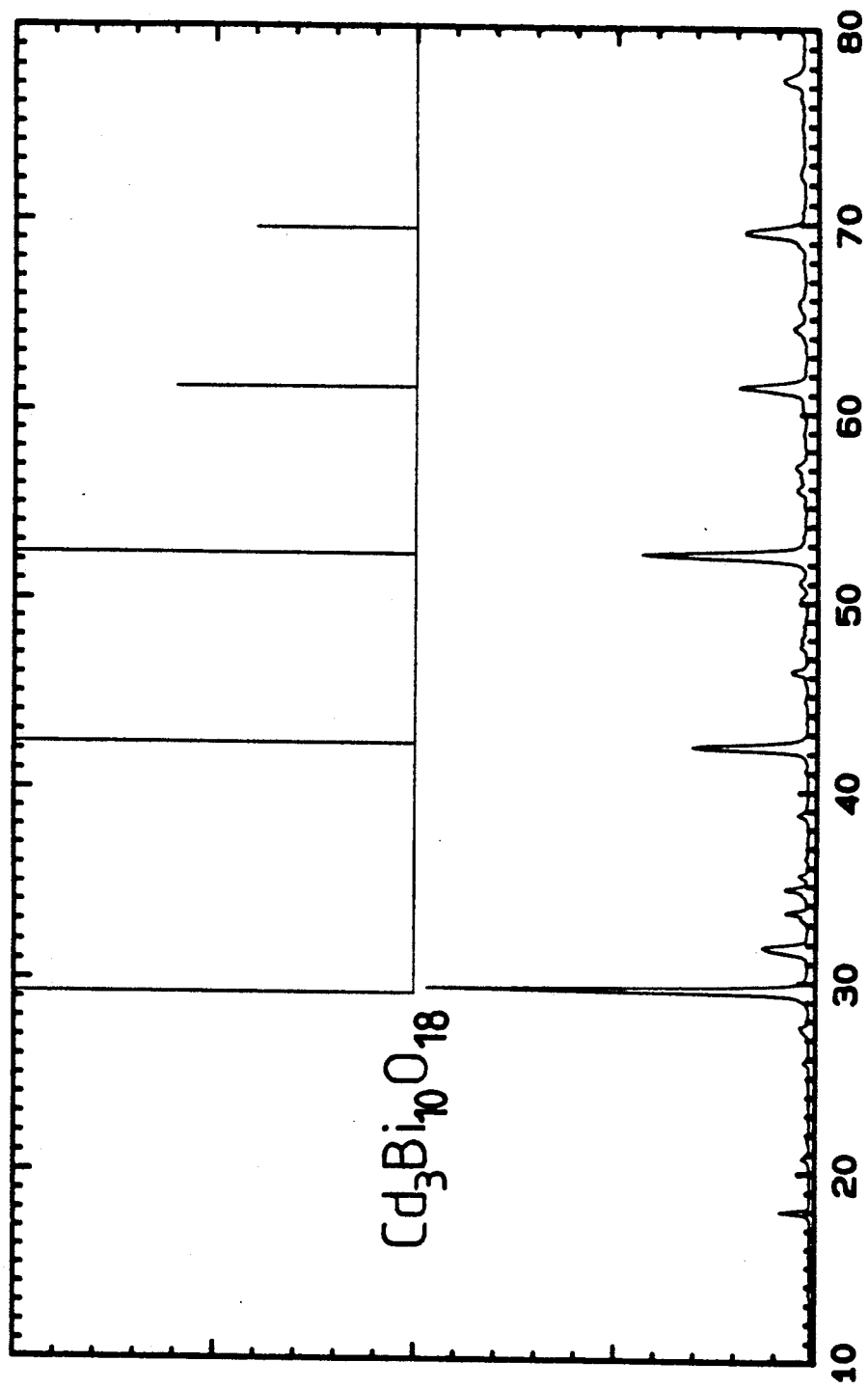
FIG. 2 shows X-ray powder diffraction pattern for a "x=0.429" composite sample compared to pattern for $Cd_3Bi_{10}O_{18}$ reported in the literature.

This phase appears to be isomorphous (FIG. 2) with the high-temperature form of $Cd_3Bi_{10}O_{18}$ reported by Kutvitskii et al (7). However, the cadmium compound is reported to have a unit cell dimension of a/2, 4.24 Angstroms.

Figure 3:
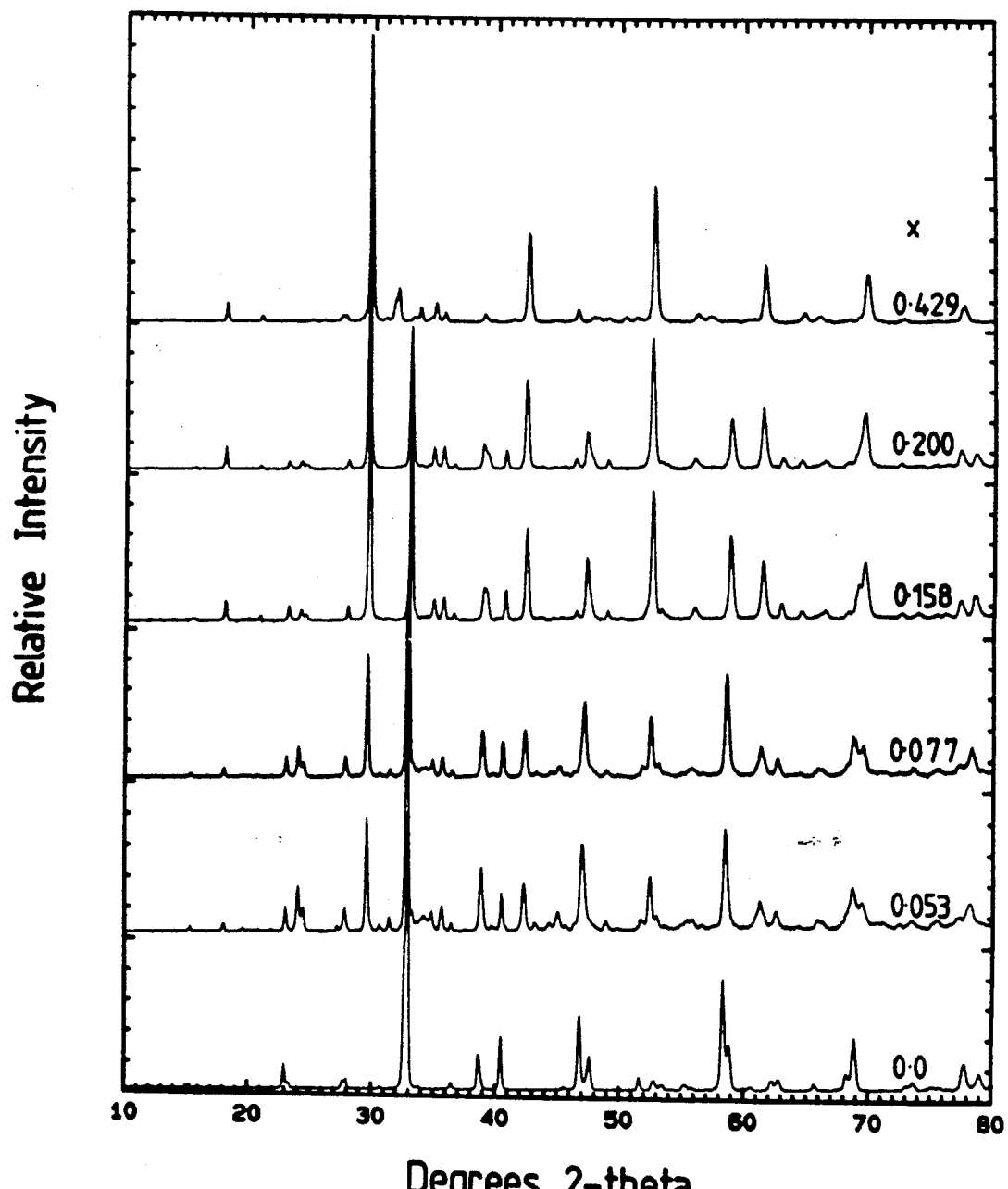
FIG. 3 shows X-ray powder diffraction patterns for material made by the "coprecipitated carbonate" method.

The corresponding x-ray patterns from the coprecipitated set of materials are shown in FIG. 3. The very strong similarity between the sets suggests that the formation of the cubic phase is a thermodynamically controlled phenomenon rather than a diffusion-controlled process. In the coprecipitated set, small peaks associated with traces of unreacted barium carbonate at $2\theta \sim 24°$ can be seen. Also, Y-123 peaks, which persist to $x=0.158$ in the composite set, appear to collapse to single peaks, even at the lowest level of Bi-2212 incorporation ($x=0.053$). This indicates that, in addition to the formation of the cubic structure, the Y-123 phase is being transformed to a tetragonal structure in the presence of the Bi-2212 components.

From the x-ray powder patterns, it was calculated that the composite sample with $x=0.2$ has a Y-123 concentration of 40($\pm$10) wt %. This implies that approximately ⅓ of the Y-123 has reacted with the Bi to form the cubic phase.

FIG. 6-a shows a scanning electron micrograph of a fracture surface produced by breaking a pellet made from the $x=0.158$ composite material. Two different morphologies are clearly visible: a smooth, dark, sintered region (A), and areas consisting of approximately 1 μm-sized discrete, white particles (B). Bismuth and copper x-ray fluorescence maps of this same region are shown in FIGS. 6-b and 6-c, respectively. The copper appears to be associated mainly with the smooth regions and the bismuth with the discrete particles. EDX spectra of these two regions show that A contains Y, Ba, Cu, with only traces of Ca and Sr, while B contains Y, Bi and Ba, with traces of Ca and Cu. These two compositions appear to be associated with the Y-123 and cubic phases respectively.

FIG. 6-d shows the equivalent $x=0.158$ material, prepared by coprecipitation. In this sample, the large, smooth, dark areas are replaced by 5-10 μm "chunks". These contain Y, Ba, Cu, and traces of Ca, and Sr, as in the composite sample, but they also contain a trace of bismuth. The presence of Bi may induce the Y-123 phase to adopt the tetragonal structure seen in the x-ray pattern of this material. This behavior has been observed in Y-123 that has been doped with iron (3-6): as little as a 2% substitution of iron for copper in Y-123 can lead to an orthorhombic-to-tetragonal transformation, without loss of superconductivity. The B particles are also present in the coprecipitated sample and have a similar Y-Bi-Ba composition (with traces of Ca and Cu) to those seen in the composite material.

At $x=0.429$, the B particles corresponding to the cubic phase dominate the structures as seen by S.E.M. As before, for both composite and coprecipitated samples, this phase appears (by EDX) to consist primarily of Y, Bi and Ba, with traces of Ca and Cu. The remainder of the copper is mostly present as small, smooth chunks, which, in the composite material, contain only traces of the other elements, and in the coprecipitated sample, contain large concentrations of both strontium and calcium. It appears that both phases in these complex systems exist as solid solutions, and that the exact partition of the elements between the phases is a kinetically controlled phenomenon, determined by the starting materials from which they were synthesized.

Figure 4:
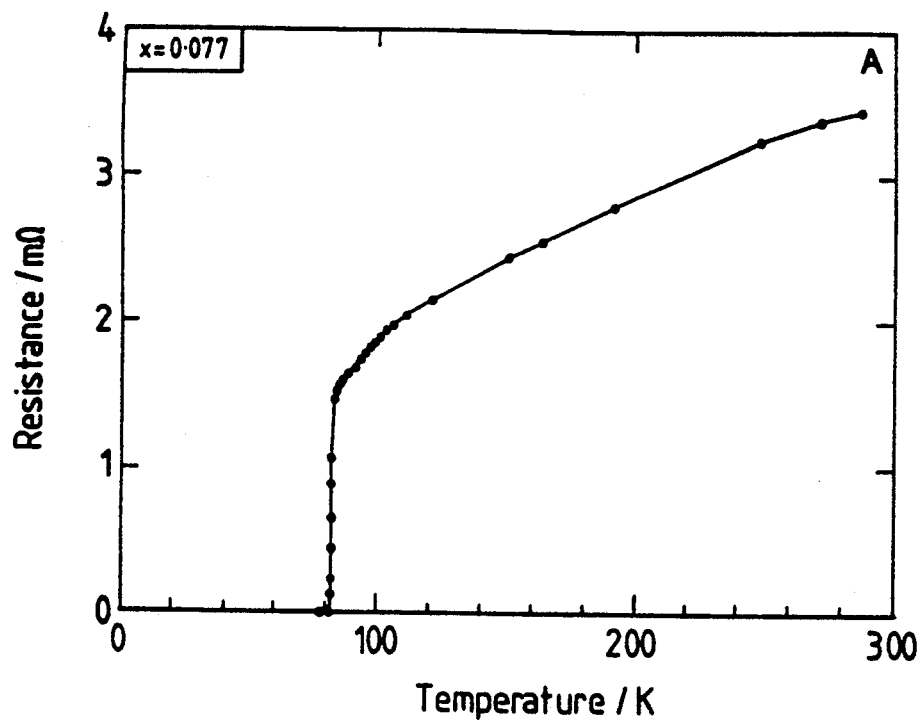
FIG. 4 shows Resistance vs. Temperature curve for x=0.158 sample produced by the "composite" method.
Figure 5:
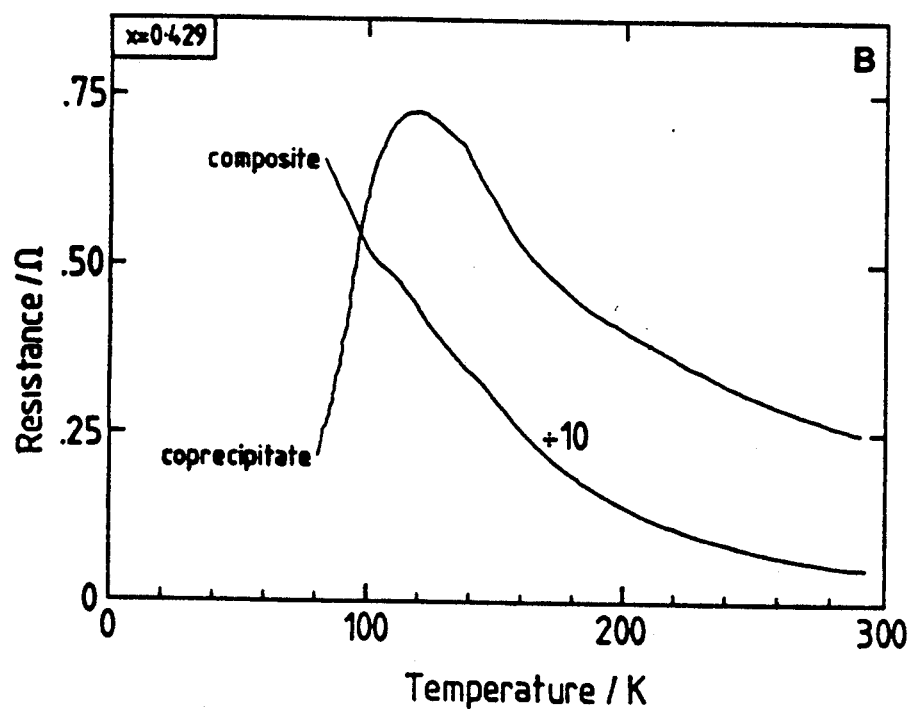
FIG. 5 shows Resistance vs Temperature curves for x=0.429 samples made by the "composite" and "coprecipitate" methods.

The results of resistivity vs. temperature measurements are summarized in Table I. The starting Y-123 showed zero resistance at 92K. All samples except those with the highest bismuth concentration ($x=0.429$) show a sudden drop in resistance with an onset temperature of $\sim 88$K. All the composite samples that show this drop reach a measured zero resistance at 83K (see, for example, FIG. 4). This indicates the persistence of an interconnected superconducting phase. Three of the coprecipitated samples show a resistance vs. temperature curve with a similar shape to the superconducting composite samples. However, in these materials, the sudden resistance drop terminates in a small, finite value at $\sim 83$K. This small residual resistance is probably due to a thin coating of $BaCO_3$ (the presence of which was indicated by XRD) between superconducting grains. Both of the two $x=0.429$ samples show an increasing resistance with temperature down to 120K. In the composite sample, this trend continues down to the lowest temperatures investigated (81K), while in the coprecipitated sample, the temperature coefficient of resistance appears to change sign at $\sim 120$K (see FIG. 5). Resistance drops in all other samples correlate with a large diamagnetic signal detected in A.C. susceptibility measurements. However, in the $x=0.429$ coprecipitated material, no such signal was detected, indicating that the resistance drop is due to a semiconductor-to-metal transition. Although the corresponding composite sample appears to be semiconducting at all temperatures investigated, FIG. 5 shows that a resistance fluctuation is present at 120K, indicating that a small fraction of this sample may also be undergoing a similar transition. The differences between the samples are probably due to minor variations in the cubic phase solid solution composition.

From the above, it is evident that Bi-2212 reacts completely with Y-123 at 950° C. to produce a new, face-centered cubic phase of side 8.55 Angstroms, containing yttrium, bismuth and barium, with traces of copper and calcium in solid solution.

XRD analysis of the x=0.2 composite sample showed only the cubic and Y-123 phases to be present, the latter making up ~40 wt. % of the total. It is remarkable that this sample was superconducting at 83K in the presence of ~60 wt. % of non-superconducting material, as shown by both resistivity and magnetic susceptibility measurements. The $T_c$ of both composite and coprecipitated superconducting materials is quite constant at 83K, irrespective of Bi content. This is surprising, given the extensive solid solution formation and cation substitution by Ca and Bi, that in the composite case is sufficient to change the Y-123 from an orthorhombic into a tetragonal structure.

References

1. Siegrist, T.; Sunshine, S.; Murphy, D. W.; Cava, R. J.; Zahurak, S. M. *Phys. Rev. B* 1987, 35, 7137-9.
2. Subramanian, M. A.; Torardi, C. C.; Calabrese, J. C.; Gopalakrishnan, J.; Morrissey, K. J.; Askew, T. R.; Flippen, R. B.; Chowdhry, U.; Sleight, A. W. *Science* 1988, 239, 1015-7.
3. Maeno, Y.; Tomita, T.; Kyogoku, M.; Awaji, S.; Aoki, Y.; Hoshino, K.; Minami, A.; Fujita, T. *Nature* 1987, 328, 512-4.
4. Oda, U.; Fujita, H.; Toyoda, H.; Kaneko, T.; Kohara, T.; Nakada, I.; Asayama, K. *Japan J. Appl. Phys.* 1987, 26, L1660-3.
5. Maeno, Y.; Kato, M.; Aiki, Y.; Fujita, T. *Japan J. Appl. Phys.* 1987, 26, L1982-4.
6. Takayama-Muromachi, E.; Uchida, Y.; Kato, K. *Japan J. Appl. Phys.* 1987, 26, L2087-90.
7. Kutvitskii, V. A.; Kosov, A. V.; Skorikov, V. M.; Koryagina, T. I. *Inorg. Mater. (USSR)* 1975, 11, 1880-3.

I claim:

1. Oxide of Y, Bi, and Ba, in a face-centered cubic phase with a=8.55 Angstroms and having a semi-conductor to metal transition at about 120° K.

2. Composition consisting of about 60 weight % of the oxide of claim 1 and about 40 weight % of a superconducting oxide of $YBa_2Cu_3$ and an interconnected phase.

3. Process comprising reacting together at least two superconducting to form a superconducting product containing a non-superconducting component, wherein at least one of the superconductor reactants is an oxide containing L-M-A where:

L is at least one trivalent metal, including bismuth and the rare earth group including scandium and yttrium;

M is at least one bivalent Metal, including barium, beryllium, magnesium, calcium, and strontium; and A is at least one metal of multiple valency including niobium, copper, silver and gold.

4. Process of preparing superconducting oxide of Bi, Sr, Ca, Y, Ba, and Cu comprising:

(A) reacting aqueous solution of nitrates of Bi, Sr, Ca, Y, Ba, and Cu with a stoichiometric equivalent of a solution of quaternary ammonium, carbonate so as to form coprecipitates of the carbonates of Bi, Sr, Ca, Y, Ba, and Cu and to provide excess $YBa_2Cu_3$;

(B) recovering and drying the carbonates; and (C) calcining the dried carbonates to form a composition containing an oxide of Y, Bi, and Ba in a face-centered cubic phase with a=8.55 Angstroms and having a semi-conductor to metal transition at about 120° K. and also containing a superconducting oxide of $YBa_2Cu_3$ as an interconnected phase.

5. Process comprising reacting superconducting orthorhombic $YBa_2Cu_3$ oxide with superconducting $Bi_2Sr_2CaCu_2$ oxide to form a superconducting product consisting essentially of:

(I) a nonsuperconducting compound containing oxide of Y, Bi, and Ba, with traces of Sr, Ca, and Cu, having a face-centered cubic phase with a=8.55 Angstroms, and a semi-conductor-to-metal transition at about 120° K.; and (II) a tetragonal superconducting $YBa_2Cu_3$ oxide as an interconnected phase throughout the product.

6. Process according to claim 5 using a reactant ratio of $(YBa_2Cu_3)_{(1-x)}(Bi_2Sr_2CaCu_2)_x$ where x=0.2 whereby in the finished product I is present at about 60 weight % and II at about 40 weight %.

7. Process according to claim 3, 4, 5, or 6, wherein the calcination is carried out at about 950° C.

* * * * *